(12) United States Patent
Peumans et al.

(10) Patent No.: US 6,440,769 B2
(45) Date of Patent: Aug. 27, 2002

(54) PHOTOVOLTAIC DEVICE WITH OPTICAL CONCENTRATOR AND METHOD OF MAKING THE SAME

(75) Inventors: Peter Peumans; Stephen R. Forrest, both of Princeton, NJ (US); Vladimir Bulovic, Lexington, MA (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/755,864

(22) Filed: Jan. 5, 2001

Related U.S. Application Data

(63) Continuation-in-part of application No. 09/449,800, filed on Nov. 26, 1999, now Pat. No. 6,333,458.
(60) Provisional application No. 60/174,455, filed on Jan. 5, 2000.

(51) Int. Cl.[7] .......................... H01L 31/18; H01L 31/052
(52) U.S. Cl. ............................. 438/65; 438/82; 438/66; 136/246; 136/259; 136/251; 427/74; 427/162; 257/432; 257/433; 257/437
(58) Field of Search ............................... 136/246, 259, 136/251; 257/432, 433, 437; 438/82, 65, 66; 126/690, 694; 359/853; 264/1.1, 1.7, 1.9; 29/17.2; 427/74, 162

(56) References Cited

U.S. PATENT DOCUMENTS

| | | | |
|---|---|---|---|
| 3,923,381 A | | 12/1975 | Winston |
| 4,007,729 A | * | 2/1977 | Chao et al. ............... 126/646 |
| 4,029,519 A | * | 6/1977 | Schertz et al. ............ 136/246 |
| 4,099,515 A | * | 7/1978 | Schertz .................... 126/661 |
| 4,240,692 A | * | 12/1980 | Winston ................... 136/246 |
| 4,255,212 A | * | 3/1981 | Chappell et al. ........... 438/66 |
| 4,291,191 A | | 9/1981 | Dahlberg |
| 4,357,486 A | | 11/1982 | Blieden et al. |
| 4,454,371 A | | 6/1984 | Folino |
| 4,638,110 A | | 1/1987 | Erbert |
| 4,667,060 A | | 5/1987 | Spitzer |
| 4,889,565 A | | 12/1989 | Fan et al. |
| 6,198,091 B1 | | 3/2001 | Forrest et al. |
| 6,198,092 B1 | | 3/2001 | Forrest et al. |
| 6,252,155 B1 | * | 6/2001 | Ortabasi ................... 136/246 |
| 6,294,723 B2 | * | 9/2001 | Uematsu et al. ........... 136/246 |

OTHER PUBLICATIONS

Forrest et al., U.S. Patent Appln. Ser. No. 09/136,342, "Organic Photosensitive Optoelectronic Devices With Transparent Electrodes", filed Aug. 19, 1998.
Forrest et al., U.S. Patent Appln. Ser. No. 09/136,166, "Organic Photosensitive Optoelectronic Devices With a Top Transparent Electrode", filed Aug. 19, 1998.
Forrest et al., U.S. Patent Appln. Ser. No. 09/136,377, "Stacked Organic Photosensitive Optoelectronic Devices With An Electrically Series Configuration", filed Aug. 19, 1998.
W.T. Welford and R. Winston, *High Collection Nonimaging Optics*, pp. 172–175, Academic Press, 1989.

* cited by examiner

*Primary Examiner*—Alan Diamond
(74) *Attorney, Agent, or Firm*—Kenyon & Kenyon

(57) ABSTRACT

A method of fabricating a low-cost, flexible and highly efficient photovoltaic device. The method includes providing a layer of thin film, shaping the thin film into a plurality of parabolic shaped concentrators, forming an aperture in the bottom of each of the parabolic shaped concentrators, coating the concentrators with a reflective material, encapsulating the concentrators with a transparent insulating layer, depositing a photovoltaic cell on the bottom parabolic shaped concentrators, and depositing an anti-reflection coating on the top of the parabolic shaped concentrators.

24 Claims, 8 Drawing Sheets

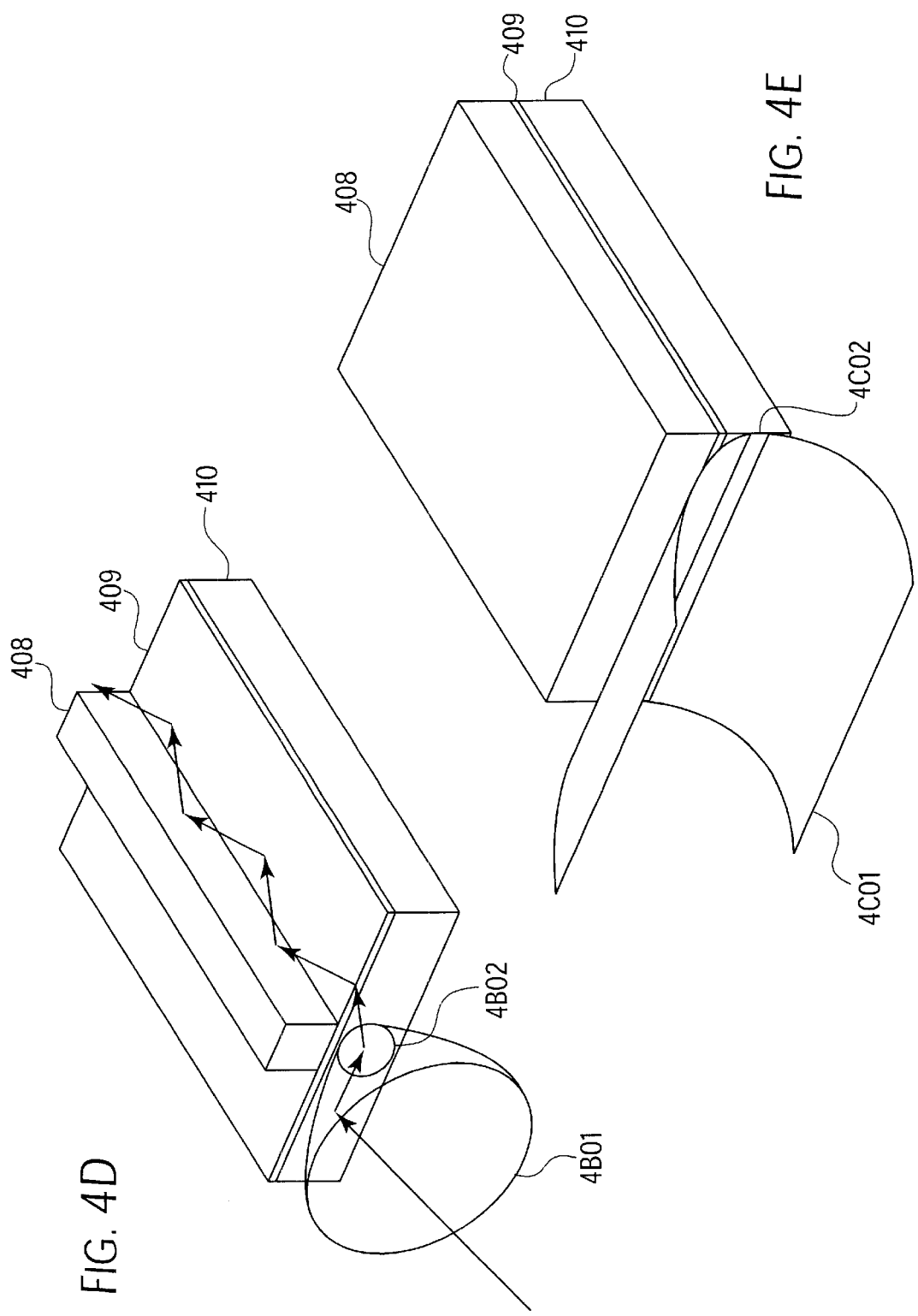

PHOTOVOLTAIC DEVICE WITH OPTICAL CONCENTRATOR AND METHOD OF MAKING THE SAME

RELATED U.S. APPLICATION DATA

This application claims the benefit of U.S. Provisional Application No. 60/174,455 filed Jan. 5, 2000, and is a continuation-in-part of U.S. patent application Ser. No. 09/449,800 filed Nov. 26, 1999 now U.S. Pat. No. 6,333,458.

FIELD OF INVENTION

The present invention generally relates to thin-film photovoltaic devices (PVs). More specifically, it is directed to photovoltaic devices, e.g., solar cells, with structural designs to enhance photoconversion efficiency by optimizing optical geometry for use with optical concentrators. Further, the present invention is directed to a low cost fabrication process for making such photovoltaic devices.

BACKGROUND OF THE INVENTION

Optoelectronic devices rely on the optical and electronic properties of materials to either produce or detect electromagnetic radiation electronically or to generate electricity from ambient electromagnetic radiation. Photovoltaic devices convert electromagnetic radiation into electricity. Solar cells, also known as photovoltaic devices, are specifically used to generate electrical power. PV devices are used to drive power consuming loads to provide, for example, lighting, heating or to operate electronic equipment such as computers or remote monitoring or communications equipment. These power generation applications also often involve the charging of batteries or other energy storage devices so that equipment operation may continue when direct illumination from the sun or other ambient light sources is not available.

The falloff in intensity of an incident flux of electromagnetic radiation through a homogenous absorbing medium is generally given by:

$$I = I_0 e^{-\alpha x} \quad (1)$$

where $I_0$ is the intensity at an initial position (at x=0), $\alpha$ is the absorption constant and x is the depth from x=0. Thus, the intensity decreases exponentially as the flux progresses through the medium. Accordingly, more light is absorbed with a greater thickness of absorbent media or if the absorption constant can be increased. Generally, the absorption constant for a given photoconductive medium is not adjustable. For certain photoconductive materials, e.g., 3,4,9,10-perylenetetracarboxylic-bis-benzimidazole (PTCBI), or copper phthalocyanine (CuPc), very thick layers are undesirable due to high bulk resistivities. By suitably re-reflecting or recycling light several times through a given thin film of photoconductive material the optical path through a given photoconductive material can be substantially increased without incurring substantial additional bulk resistance. A solution is needed, therefore, which efficiently permits electromagnetic flux to be collected and delivered to the cavity containing the photoconductive material while also confining the delivered flux to the cavity so that it can be absorbed.

Less expensive and more efficient devices for photogeneration of power have been sought to make solar power competitive with presently cheaper fossil fuels. Therefore organic photoconductors, such as CuPc and PTCBI, have been sought as materials for organic photovoltaic devices (OPVs) due to potential cost savings. The high bulk resistivities noted above make it desirable to utilize relatively thin films of these materials. However, the use of very thin organic photosensitive layers presents other obstacles to production of an efficient device. As explained above, very thin photosensitive layers absorb a small fraction of incident radiation thus keeping down external quantum efficiency. Another problem is that very thin films are more subject to defects such as shorts from incursion of the electrode material. Co-pending U.S. patent application Ser. No. 09/449,800 entitled "Organic Photosensitive Optoelectronic Device With an Exciton Blocking Layer" to Forrest et al. incorporated herein by reference describes photosensitive heterostructures incorporating one or more exciton blocking layers which address some of the problems with very thin film OPVs. However, other solutions are needed to address the problem of low photoabsorption by very thin films, whether the films are organic or inorganic photoconductors.

The use of optical concentrators, as known as Winston collectors, is common in the fields of solar energy conversion. Such concentrators have been used primarily in thermal solar collection devices wherein a high thermal gradient is desired. To a lesser extent, they have been used with photovoltaic solar conversion devices. However, it is thought that such applications have been directed to devices wherein photoabsorption was expected to occur upon initial incidence of light upon the active photoconductive medium. If very thin photoconductor layers are used, it is likely that much of the concentrated radiation will not be absorbed. It may be reflected back into the device environment, absorbed by the substrate or merely pass through if the substrate is transparent. Thus, the use of concentrators alone does not address the problem of low photoabsorption by thin photoconductive layers.

Optical concentrators for radiation detection have also been used for the detection of Cerenkov or other radiation with photomultiplier ("PM") tubes. PM tubes operate on an entirely different principle, i.e., the photoelectric effect, from solid state detectors such as the OPVs of the present invention. In a PM tube, low photoabsorption in the photoabsorbing medium, i.e., a metallic electrode, is not a concern, but PM tubes require high operating voltages unlike the OPVs disclosed herein.

The cross-sectional profile of an exemplary non-imaging concentrator is depicted in FIG. 1. This cross-section applies to both a conical concentrator, such as a truncated paraboloid, and a trough-shaped concentrator. With respect to the conical shape, the device collects radiation entering the circular entrance opening of diameter $d_1$ within $\pm\theta_{max}$ (the half angle of acceptance) and directs the radiation to the smaller exit opening of diameter $d_2$ with negligible losses and can approach the so-called thermodynamic limit. This limit is the maximum permissible concentration for a given angular field of view. A trough-shaped concentrator having the cross-section of FIG. 1 aligned with its y axis in the east-west direction has an acceptance field of view well suited to solar motion and achieves moderate concentration with no diurnal tracking. Vertical reflecting walls at the trough ends can effectively recover shading and end losses. Conical concentrators provide higher concentration ratios than trough-shaped concentrators but require diurnal solar tracking due to the smaller acceptance angle. (After *High Collection Nonimaging Optics* by W. T. Welford and R. Winston, (hereinafter "Welford and Winston") pp 172–175, Academic Press, 1989, incorporated herein by reference).

SUMMARY AND OBJECTS OF INVENTION

The present invention discloses photovoltaic device structures which trap admitted light and recycle it through the contained photosensitive materials to maximize photoabsorption. The device structures are particularly suited for use in combination with optical concentrators.

It is an object of this invention to provide a high efficiency photoconversion structure for trapping and converting incident light to electrical energy.

It is a further object to provide a high efficiency photoconversion structure incorporating an optical concentrator to increase the collection of light.

It is a further object to provide a high efficiency photoconversion structure in which the incident light is admitted generally perpendicular to the planes of the photosensitive material layers.

It is a further object to provide a high efficiency photoconversion structure in which the incident light is admitted generally parallel to the planes of the photosensitive material layers.

It is a further object to provide a high efficiency photoconversion structure utilizing generally conical parabolic optical concentrators.

It is a further to provide a high efficiency photoconversion structure utilizing generally trough-shaped parabolic optical concentrators.

It is a further object to provide a high efficiency photoconversion structure having an array of optical concentrators and waveguide structures with interior and exterior surfaces of the concentrators serving to concentrate then recycle captured radiation.

It is a still further object to provide a low cost method for making such highly efficient photovoltaic devices.

BRIEF DESCRIPTION OF THE DRAWINGS

The foregoing and other features of the present invention will be more readily apparent from the following detailed description of exemplary embodiments taken in conjunction with the attached drawings.

FIG. 2A is side view of a perpendicular type embodiment with a concentrator attached.

FIG. 2B is top down view of FIG. 2A along line A—A having a circular aperture for use with a conical concentrator.

FIG. 2C is a top down view of FIG. 2A along line A—A having a rectangular aperture for use with a trough-shaped concentrator.

FIG. 2D is a perspective representation of a collection of perpendicular type PVs with conical concentrators.

FIG. 2E is a perspective representation of a collection of perpendicular type PVs with trough-shaped concentrators.

FIGS. 4A–4E depict embodiments of device structures in accord with the present invention in which light is accepted in a direction generally parallel to the planes of the photosensitive layers.

FIG. 4A is side view of a parallel type embodiment with a concentrator attached.

FIG. 4B is end-on view of FIG. 4A along line B—B having a circular aperture for use with a conical concentrator.

FIG. 4C is a end-on view of FIG. 4A along line B—B having a rectangular aperture for use with a trough-shaped concentrator.

FIG. 4D is a perspective representation of a parallel type PV with a conical concentrator.

FIG. 4E is a perspective representation of a parallel type PV with a trough-shaped concentrator.

DETAILED DESCRIPTION

Figure 2A:
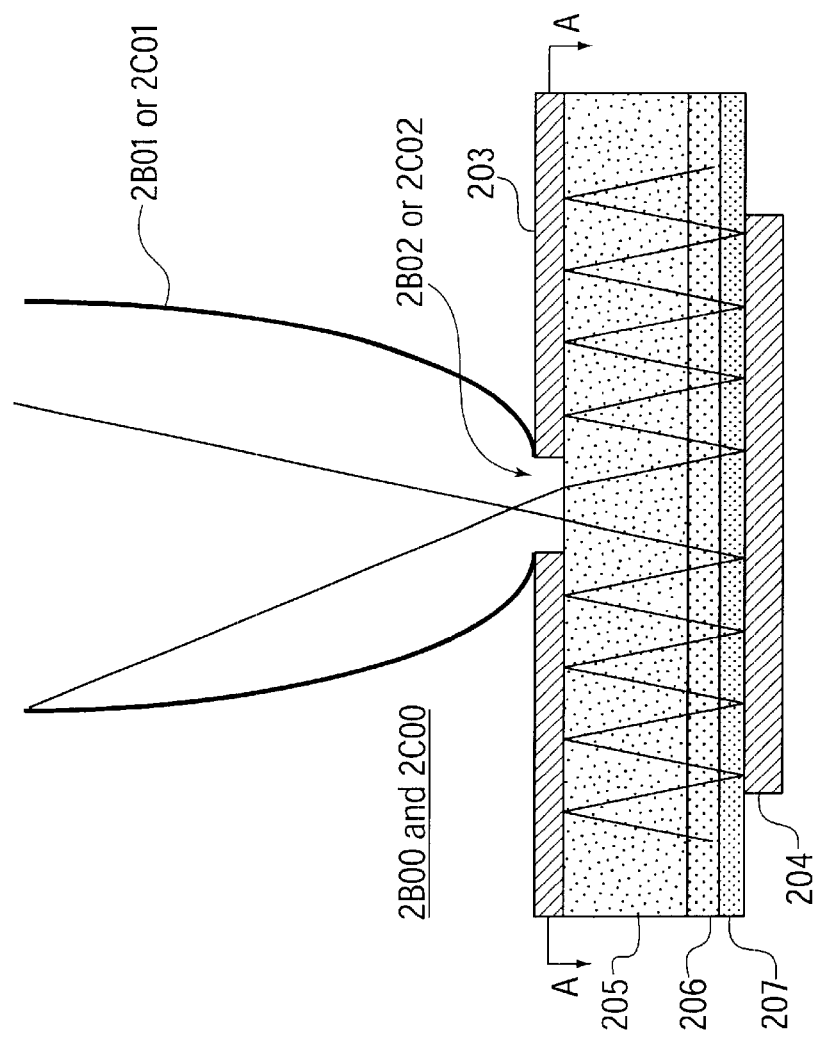
FIGS. 2A–2E depict embodiments of device structures in accord with the present in which light is accepted in a direction generally perpendicular to the planes of the photosensitive layers.

In FIG. 2A, a cross-sectional view which can correspond to two different device structures is depicted. Both structures permit light to be introduced into a reflective cavity, or waveguide, containing photosensitive layers such that the light is initially incident in a direction generally perpendicular to the planes of the photosensitive layers so this type of structure is generally referred to herein as a "perpendicular type structure". A perpendicular type structure can have two types of preferably parabolic cross-section concentrators as described above—"conical" and "trough-shaped"—. FIGS. 2B–2E provide different views on conical versus trough-shaped structures whose common cross-section is shown in FIG. 2A. The same numerals are used for corresponding structure in each of FIGS. 2A–2E.

Figure 2C:
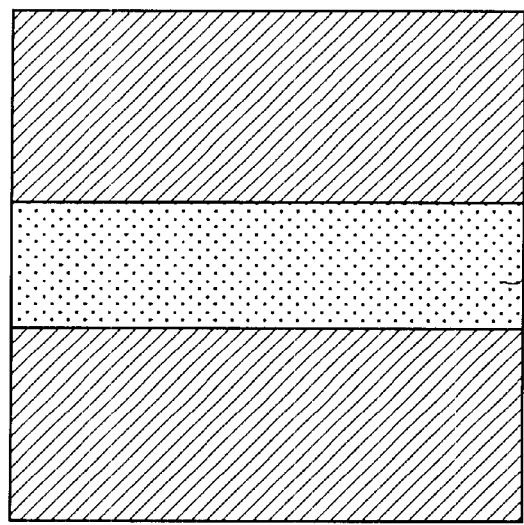
Figure 2B:
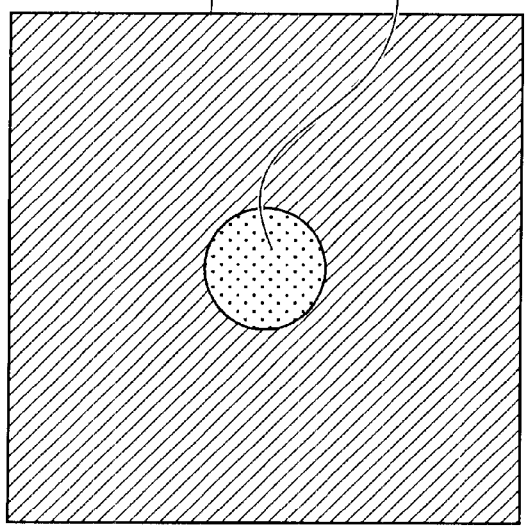

Accordingly, light incident from the top of these embodiments enters into one or more concentrator structures 2B01 (conical) or 2C01 (trough-shaped). The light admitted to each concentrator is then reflected into an aperture 2B02 or 2C02 in top reflective layer 203. As shown in FIGS. 2B and 2C, aperture 2B02 is a generally circular shaped opening for use with a conical concentrator, and aperture 2C02 is a generally rectangular shaped opening for use with a trough-shaped concentrator. Only the bottom surface of layer 203 need be reflective so the top surface may be non-reflective and/or be optionally coated with, for example, a protective layer to enhance weather resistance. Passivated oxides or polymer coatings, for example, may be suitable protective coatings. After passing through the aperture, the admitted radiation is trapped in a waveguide structure formed between top layer 203 and bottom reflective layer 204. The space between the two layers is occupied by several layers comprising a thin film photovoltaic device of the type such as those disclosed in co-pending U.S. patent application Ser. Nos. 09/136,342, 09/136,166, 09/136,377, 09/136,165, 09/136,164, 09/449,800 to Forrest et al. (the "Forrest Applications"), which are herein incorporated by reference in their entirety.

More specifically, in an exemplary embodiment of a thin film PV cell with an optical concentrator geometry, and with reference particularly to FIG. 2A, below top layer 203 is a transparent. insulating layer 205 of, for example, glass or plastic, through which the light admitted by aperture 2B02 or 2C02 initially traverses. On its initial pass, the light then traverses a transparent electrode 206 of, for example, degenerately doped indium tin oxide (ITO). On its initial pass, the light then traverses one or more active layers 207 which may include one or more rectifying junctions, or exciton blocking layers for efficient conversion of optical energy to electrical energy. Any light which is not absorbed on this pass is reflected by layer 204 back through active layers 207. transparent electrode 206, and transparent insulating layer 205 to be reflected off of top layer 203 to repeat the cycle again until the light is completely absorbed. Layer 203 may be comprised of a metallic material or a ¼ wavelength dielectric stack of the type known in the art. Layer 204 is typically a metallic film such as silver or aluminum which also can serve as the lower electrode. Alternatively, the lower electrode could be in whole or part a transparent conductive material such as degenerately doped ITO in conjunction with a reflective metallic film which in turn could optionally be deposited upon a substrate such as glass, metal or plastic. FIG. 2A depicts two typical incident light rays. Those of ordinary skill in the art will appreciate that there are numerous other possible trajectories for incident radiation and that the ray depicted is merely for illustration.

The process of trapping the admitted light until it is absorbed enhances the efficiency of the photoconversion and may be referred to as "optical recycling" or "photon recycling". A structure designed to trap light within may generally be called a waveguide structure, or also an optical cavity or reflective cavity. The optical recycling possible within such optical cavities or waveguide structures is particularly advantageous in devices utilizing relatively high resistance organic photosensitive materials since much thinner photoactive layers may be used without sacrificing conversion efficiency.

Figure 2D:
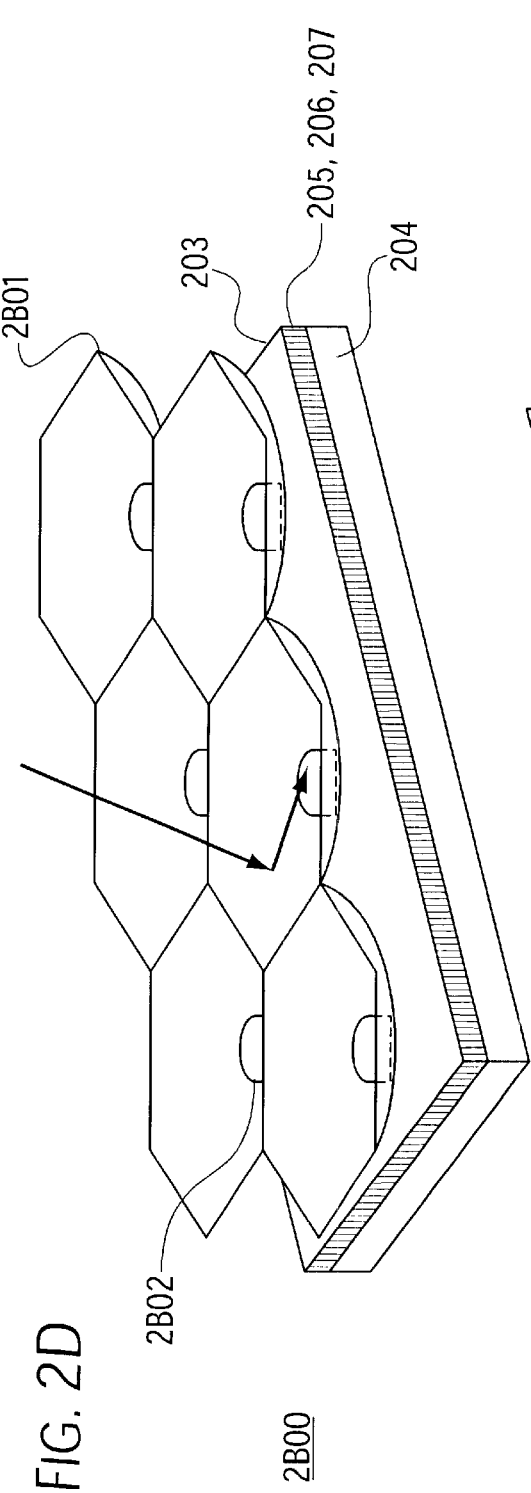
Figure 2E:
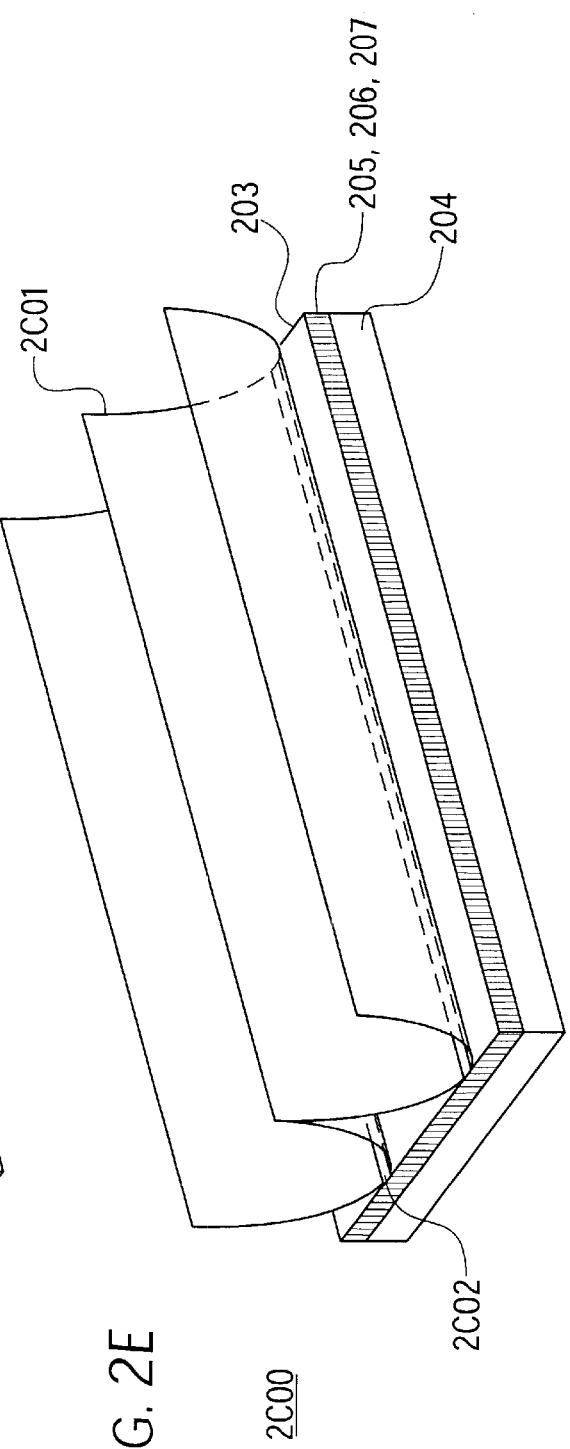

In FIGS. 2D and 2E, a plurality of PV cells with concentrators are shown in one integrated structure. Those of ordinary skill in the art would appreciate that the number of PV cells in such integrated structures may be increased as desired. In FIG. 2E it should be appreciated that the trough-shaped concentrator are shown having open ends. Optionally, the ends of a trough are closed with a structure having a reflecting surface facing the interior of the trough to help capture additional light into the apertures. Vertical or sloped planar surfaces may be used. Also, each end of the trough may be closed with a shape generally resembling half of a parabolic cone. Such structures permit the trough interior surface to be smoothly curved in its full extent.

Figure 3:
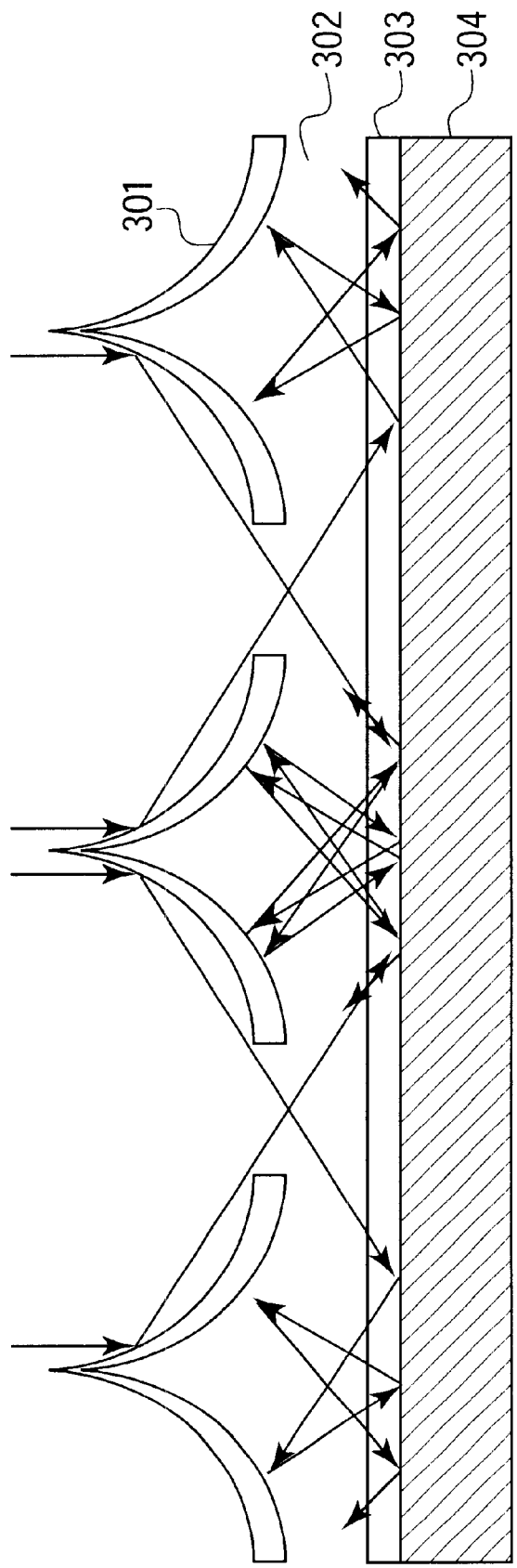
FIG. 3 is a cross-sectional view of a portion of an array of perpendicular type PVs with concentrators wherein the concentrators reflect light on their interior and exterior surfaces.

It should be appreciated in the array of perpendicular-type PVs depicted in FIGS. 2D and 2E with reference to FIG. 2A, that after the admitted light has entered an aperture 2B02 or 2C02, the light will not be reflected back across the plane defined by the top surface of the top reflective layer 203. Therefore, the space between the exterior of the concentrator and top layer 203 may be empty or filled with a non-transparent material. For mechanical stability, it is preferable that at least part of this volume should be filled with material to provide support for the concentrator. Also, it should be appreciated that the FIGS. 2A, 2D, 2E structures as described abode utilize three separate reflective surfaces for, respectively, the interior of the concentrator, the upper reflective surface of the waveguide structure and the lower reflective surface of the waveguide structure. In FIG. 3, an alternative array structure is depicted in cross-section which can utilize a single reflective film to provide both the concentrator reflections and the "upper" waveguide reflections. The concentrator/reflector 301 is a reflective layer, typically metal such as silver or aluminum, deposited on a layer 302 of molded or cast transparent insulating material such as plastic or glass. Layer 302 is made with the shape of the concentrator array formed into it. The transparent upper electrode. one or more photosensitive layers, labeled collectively as 303, and lower reflective layer (optionally also the lower electrode) 304 complete the waveguide structure. This arrangement allows the manufacture of a PV concentrator array to begin with a preformed bare concentrator array structure. Thereafter, a double-duty reflective coating can be deposited on the concentrator side of the array structure and the photoactive and conductive layers for extraction of photogenerated current can all be deposited on the lower surface using masking and photolithographic techniques. Since physical support is provided by layer 302, reflective layer 301 can be made much thinner than would be possible if layer 301 were needed to be a partly or completely self-supporting concentrator/reflector.

It should be appreciated that as just described, layer 301 has reflecting surfaces on both its interior and exterior parabolic surfaces. Optionally, layer 301 Could be two separate coatings on the interior and exterior of a generally conical or trough-shaped base material such as molded or cast plastic or glass. This implementation more easily permits the concentrator interior and exterior surface shapes to be slightly different thus permitting independent optimization of the concentrator reflections and the waveguide structure reflections.

Figure 4A:
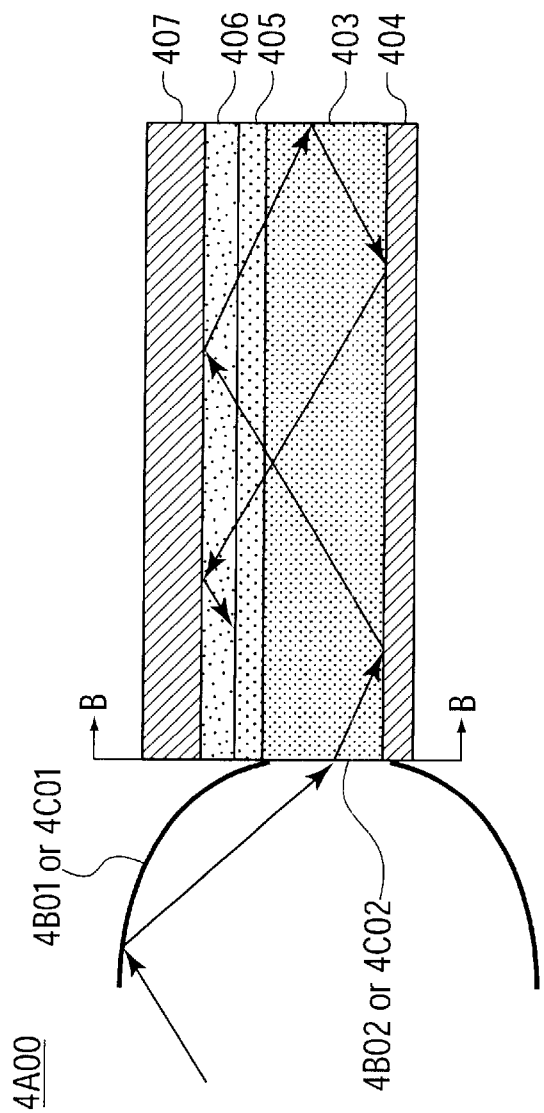

In FIGS. 4A–4E, different versions of structures which permit light to be introduced into a reflective cavity, or waveguide, containing photosensitive layers such that the light is initially incident in a direction generally parallel to the planes of the photosensitive layers so that this type of structure is generally referred to herein as a "parallel type structure". As with perpendicular type structures, parallel type structures can have both generally "conical" and "trough-shaped" type concentrators. FIGS. 4B–4F provide different views on conical versus trough-shaped structures whose common cross-section is shown in FIG. 4A. The same numerals are used for corresponding structure in each of FIGS. 4A–4E.

Figure 4C:
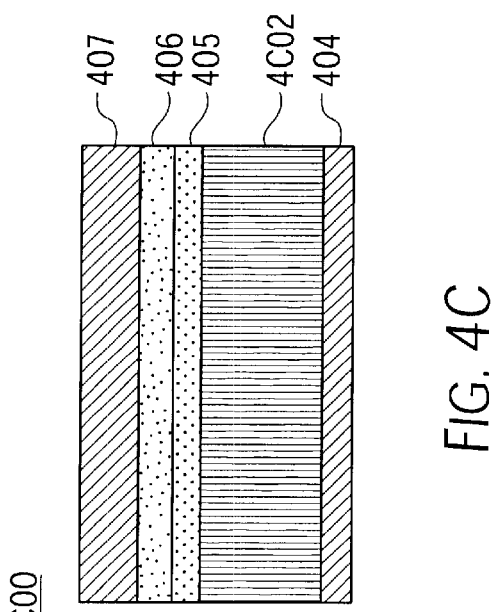
Figure 4B:
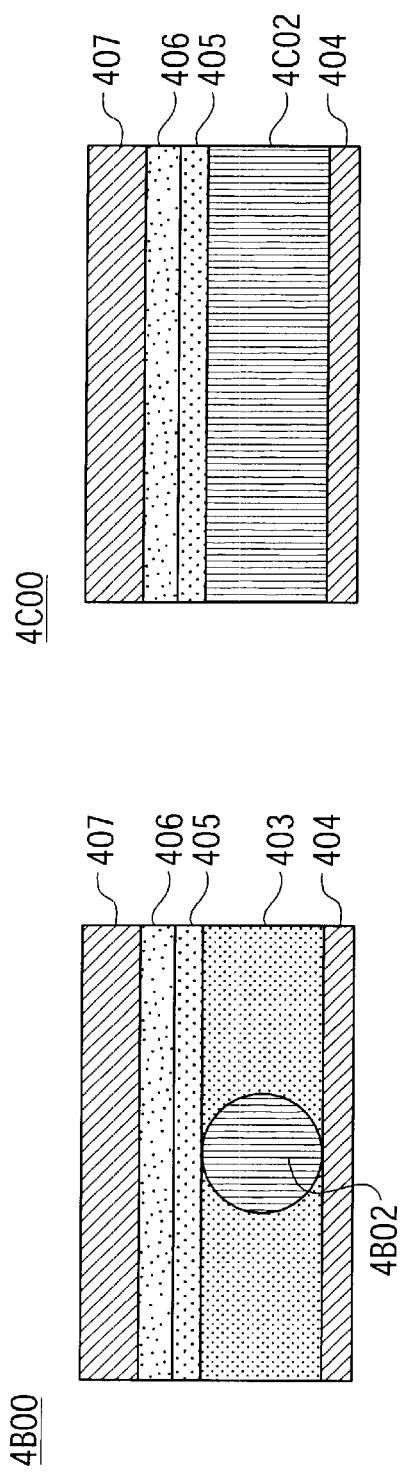

Accordingly, light incident from the top of these embodiments enters into one or more concentrator structures 4B01 (conical) or 4C01 (trough-shaped). The light admitted to each concentrator is reflected into an aperture 4B02 or 4C02 at the base of each concentrator. As shown in FIGS. 4B and 4C, aperture 4B02 is a generally circular shaped opening for use with a generally conical concentrator, and aperture 4C02 is a generally rectangular shaped opening for use with a trough-shaped concentrator. The remaining structure is now described with respect to a typical incident light ray but those of ordinary skill in the art will appreciate that there are numerous other possible trajectories for incident radiation and that the ray depicted is merely for illustration. The typical ray enters a transparent, insulating layer 403 of, for example, glass or plastic. The typical ray then reflects off reflective layer 404, which is typically a metallic film of, for example, silver or aluminum. The reflected ray then retraverses part of transparent layer 403 and then traverses transparent conductive layer 405 which serves as one electrode of the device and is typically a conductive oxide such as degenerately doped IPO. The typical ray then traverses the photoactive layers 406 which are photosensitive rectifying structures such as those described in the Forrest Applications or inorganic photosensitive optoelectronic structures made from, for example, silicon. Any optical intensity in the typical ray that has not been absorbed reflects off upper reflective layer 407 which may be a metallic reflective film of, for example, silver or aluminum and typically serves as an electrode layer. Optionally, the electrode function may be served in part or whole by a second transparent electrode with the reflective function provided by a separate layer.

In attaching the concentrator structure to the PV, care should be taken to avoid shorting of the electronically active layers. This can be accomplished by providing a thin insulating protective coating around the edges of the photoconductive layers. It should be further appreciated that a reflective coating may be optionally located around the edges of the device to reflect light back into the device. More specifically, in FIG. 4A, a reflective layer (not shown) electrically insulated from the electronically active layers would optionally be placed at the right end of FIG. 4A so that (as illustrated) the typical ray could reflect back toward the concentrator. Again the reflective layer may be comprised of a reflective material or it may be comprised of a ¼ wavelength dielectric stack. It should be appreciated that the proportions of the device depicted in the figures are merely illustrative. The device may be made generally thinner vertically and longer horizontally with the result that most light is absorbed before it ever reaches the edges of the device opposed to the concentrator. Only light which is truly normal to the plane of the aperture and thus truly parallel to the planes of the photoactive layers would have a substantial probability of reaching the edge opposite the concentrator. This should represent a small fraction of the incident light.

In FIG. 4B, aperture 4B02 is illustrated as covering a section of only transparent insulating layer 403. Provided the instructions above relating to preventing electrical shorts between electrically active layers is heeded, the concentrator 4B01 and aperture 4B02 may be disposed to allow direct illumination of transparent electrode 405 or photoactive layers 406. In FIG. 4C, it should be appreciated that transparent insulating layer 403 is not depicted since generally rectangular aperture 4C02 is shown as completely overlapping layer 403 in the view shown. As with aperture 4B02, aperture 4C02 may be varied in size along with concentrator 4C01 to provide direct illumination of more or less of the interior of the PV.

FIGS. 4D and 4E are perspective illustrations of exemplary embodiments of the present invention in parallel type structures. In FIG. 4D, a generally conical concentrator is illustrated delivering incident light to a parallel type structure having an upper reflective layer 408, one or more photosensitive layers and rectifying structures including one or more transparent electrodes labeled collectively as 409, and a transparent insulating layer and bottom reflective layer labeled collectively as 410. FIG. 4E depicts a generally trough-shaped concentrator 4C01 delivering light to a similar PV structure in which the layers are labeled accordingly. It should be appreciated that the trough-shaped concentrator is shown having open ends which may optionally be closed off with a reflecting surface as described above with regard to FIG. 2E.

The concentrator may be formed of only metal or of molded or cast glass or plastic which is then coated with a thin metallic film. With the parallel type structure, the waveguide photoabsorbing structures are more readily manufactured separately from the concentrator structures with the pieces being attached subsequently with suitable adhesive bonding materials. An advantage of the perpendicular type structure, as described above, is that its manufacture can begin with preformed concentrator structures which are used as the substrate for further build up of the device.

Figure 1:
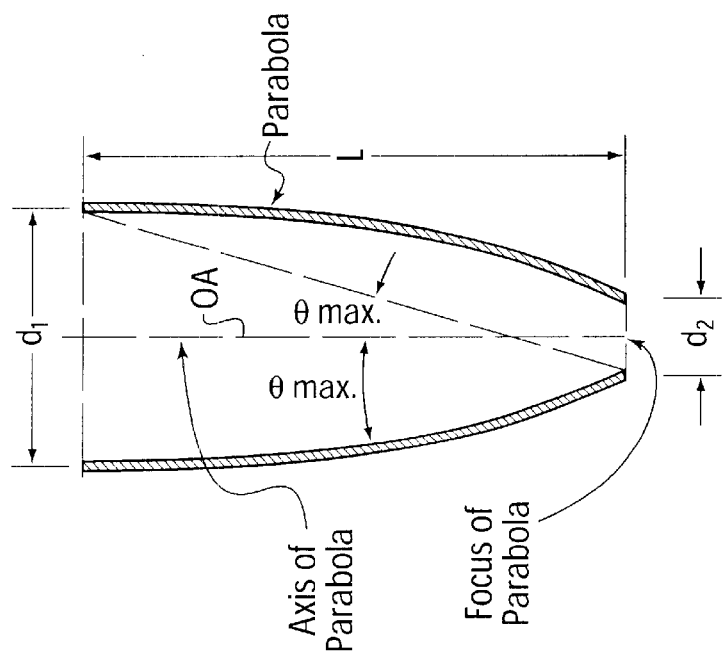
FIG. 1 is a cross-sectional profile of a prior art radiation concentrator for use in conjunction with the present invention.

It should be appreciated that the terms "conical" and "trough-shaped" are generally descriptive but are meant to embrace a number of possible structures. "Conical" is not meant to be limiting to an shape having a vertical axis of symmetry and whose vertical cross-section would have only straight lines. Rather, as described above with reference to Welford and Winston, "conical" is meant to embrace, among other things, a structure having a vertical axis of symmetry and a generally parabolic vertical cross section as depicted in FIG. 1. Further, the present invention is not limited to concentrators, either "conical" or "trough-shaped", having only smoothly curved surfaces. Rather, the general conical or trough shape may be approximated by some number of planar facets which serve to direct incident light to the exit aperture.

Further, the generally circular and generally rectangular apertures are preferred for use with optical concentrators but are exemplary. Other shapes for apertures are possible particularly in the perpendicular type structure. Concentrators having generally parabolic sloped sides may be fitted to a number of aperture shapes. However, the 3D parabolic and trough-shaped concentrator with their respective circular and rectangular apertures are preferred.

It should also be appreciated that the transparent insulating layer, e.g., 205 or 403, is present to prevent optical microcavity interference effects. Therefore, the layer should be longer than the optical coherence length of the incident light in all dimensions. Also, the transparent insulating layer can be placed on either side of the photoactive layers. For example, in FIG. 2A, the aperture could be in layer 204 and layer 203 could be just a reflecting layer. Accordingly, any concentrator 2B02 or 2C02 would be placed over the aperture wherever it may lie. This would have the effect of permitting the admitted light to reach the photoactive layers initially before reaching the transparent insulating layer. For many possible photoactive materials, however, the embodiments specifically disclosed herein, e.g., FIG. 2A, are preferred since they allow the transparent insulating layer to protect the underlying photoactive layers from the environment. Exposure to atmospheric moisture and oxygen may be detrimental to certain materials. Nonetheless, those of ordinary skill in the art would understand this alternate version of the device with the benefit of this disclosure.

Figure 5A:
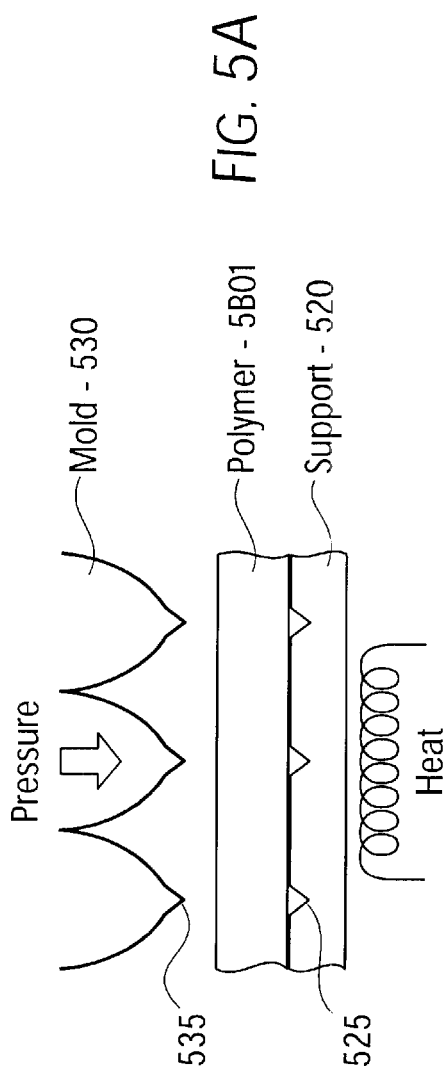
FIGS. 5A–D depicts the steps of fabricating a light trapping, photovoltaic cell of the present invention.
Figure 5B:
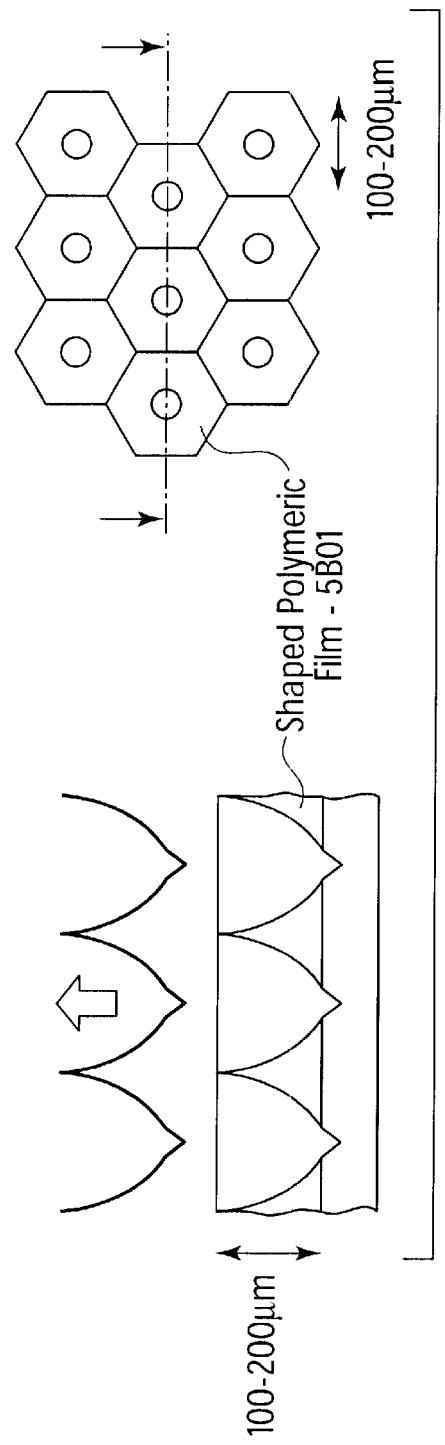

FIGS. 5A–D depicts the steps of fabricating a light trapping, photovoltaic device. Such method is relevant to all thin film photovoltaic technologies (e.g., organic, thin film silicon, etc.). The following is a description of a preferred method of fabricating a light trapping, photovoltaic cell. First, a layer of thin film is shaped into a plurality of small, Winston-type collectors or concentrators 5B01 having a parabolic profile normal to the longitudinal direction. FIGS. 5A. 5B. The layer of thin film is preferably comprised of a polymeric material. Some preferred polymeric materials include, by way of non-limiting example, PET, polystyrene, polyimide. This is preferably accomplished by placing the polymeric film atop a support 520, heating the same and then forming the film over a mold 530. The layer of thin film may be comprised of other materials including metal. The support preferably includes a plurality of V-shaped recesses 525 that are adapted to mate with pointed ends 535 that extend from the mold 530. Accordingly, the pointed ends 535 of the mold pierce the layer of thin film during the molding step in order to form the requisite apertures 5B02 in the concentrators. FIG. 5B. The thus formed concentrators preferably have a width of about 100 to about 200 µm at the open upper end thereof and a height of from about 100 to about 200 µm. FIG. 5B. Note, while the concentrator is depicted as conical in shape in FIG. 5B, a trough shaped concentrator may also be formed by utilizing an appropriately shaped mold.

Figure 5C:
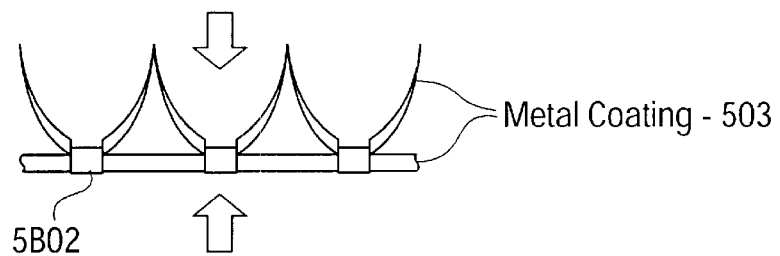
Figure 5D:
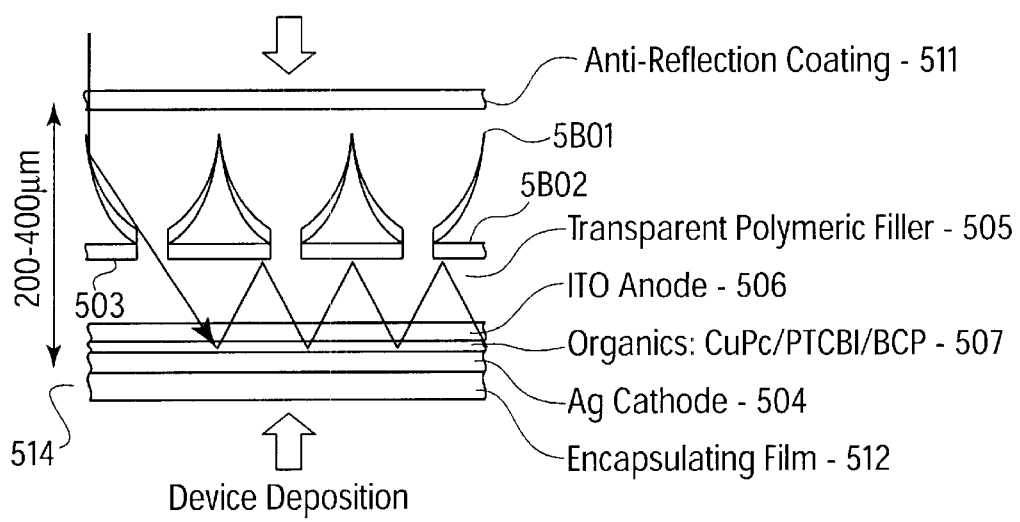

The interior and exterior parabolic surfaces of the collectors or concentrators are then coated on the top and bottom with a reflective coating 503. FIG. 5C. The coating may be comprised of a metallic material such as silver or aluminum or a dielectric material. The reflectivity on the bottom side is particularly important as light will reflect numerous times off this surface. It should be apparent that if the concentrator itself was formed from a reflective material, e.g. a metallic material, a reflective coating need not be applied. A protective layer may be applied to the reflective metal coating. Preferred materials for the protective layer include passivated oxides or polymer coatings. Thereafter, the structure is preferably completely encapsulated in a transparent material 505 such as glass or a transparent polymer. FIG. 5D. The encapsulating or filler polymer must be sufficiently stable under solar illumination, especially near the aperture where high intensities (approximately 10 suns) are encountered. Thereafter, the structure is completed by the deposition of the photovoltaic cell 514 from the bottom, and an anti-reflection coating 511 from the top. FIG. 5D. A preferred material for the anti-reflection coating is silicon dioxide. The photovoltaic cell may be of the type disclosed in the Forrest Applications. For example, the photovoltaic cell may include an anode 506, a layer of organic material 507, and a cathode 504 (preferably a silver cathode). Further, the device may be encapsulated with a layer of encapsulating film 512. The encapsulating film may be comprised of, by way of non-limiting example, polyimide, $SiO_2$, or $SN_x$. The layer of organic material may comprise a hole transporting layer such as CuPC, an electron transporting layer such as PTCBI and an exciton blocking layer such as bathocuporine (BCP). The thus formed photovoltaic device preferably has a height of from about 200 to about 400 µm.

While the particular examples disclosed herein refer preferably to organic photosensitive heterostructures the waveguide and waveguide with concentrator device geometries described herein suitable as well for other photosensitive heterostructures such as those using inorganic materials and both crystalline and non-crystalline photosensitive materials. The term "photosensitive heterostructure" refers herein to any device structure of one or more photosensitive materials which serves to convert optical energy into electrical energy whether such conversion is done with a net production or net consumption of electrical energy. Preferably organic heterostructures such as those described in the Forrest Applications are used.

Also, where a reflective electrode layer is called for herein, such electrode could also be a composite electrode comprised of a metallic layer with an transparent conductive oxide layer, for example. an ITO layer with a Mg:Ag layer. These are described further in the Forrest Applications.

It should be appreciated that the terms "opening" and "aperture" are generally synonymous and may be used herein somewhat interchangeably to refer to the optical entrance or exit of a concentrator as well as a transparent hole or window which allows radiation to reach the interior of a PV. Where it is necessary to draw a distinction between the two types of openings or apertures, for example, in the claims, antecedent context will provide the suitable distinction.

Thus, there has been described and illustrated herein waveguide structures for PVs and use particularly in conjunction with optical concentrators. Those skilled in the art, however, will recognize that many modifications and variations besides those specifically mentioned may be made in the apparatus and techniques described herein without departing substantially from the concept of the present invention. Accordingly, it should be clearly understood that the form of the present invention as described herein is exemplary only and is not intended as a limitation on the scope of the present invention.

What is claimed is:
1. A method of fabricating a light-trapping photovoltaic device comprising the steps of:
   providing a layer of thin film;
   shaping the thin film layer into a plurality of parabolic shaped concentrators;
   forming an aperture in the bottom of each of the parabolic shaped concentrators;
   coating the concentrators with a reflective material;
   encapsulating the concentrators with a transparent insulating layer;
   depositing a first reflective layer, a second transparent insulating layer adjacent the first reflective layer, a transparent first electrode layer adjacent the second transparent insulating layer, a photosensitive heterostructure adjacent the transparent first electrode layer, and a second electrode and reflective layer substantially parallel to the first reflective layer and adjacent the photosensitive heterostructure in spaced opposition to the first electrode to form a thin film photovoltaic cell on the bottom of each of the parabolic shaped concentrators,
      wherein one of the first reflective layer or the second electrode and reflective layer is deposited first and adjacent to the concentrators, and has an aperture for admittance of optical radiation to the photosensitive heterostructure; and
   depositing an anti-reflection coating on the upper end of the parabolic shaped concentrators.
2. The method of claim 1 wherein the thin film layer is comprised of a polymeric material.
3. The method of claim 1 wherein a protective layer is applied to the bottom surface of the reflective material.
4. The method of claim 1 wherein the photovoltaic cell includes an anode, an organic layer, and a cathode.
5. The method of claim 1 wherein the concentrators each have a height of about 100 to about 200 µm.
6. The method of claim 1 wherein the concentrators each have a width of about 100 to about 200 µm.
7. A method of fabricating a light-trapping photovoltaic device comprising the steps of:
   providing a layer of a reflective thin film;
   shaping the reflective thin film layer into a plurality of parabolic shaped concentrators;
   forming an aperture in the bottom of each of the parabolic shaped concentrators;
   encapsulating the concentrators with a transparent insulating layer;
   depositing a first reflective layer, a second transparent insulating layer adjacent the first reflective layer, a transparent first electrode layer adjacent the second transparent insulating layer, a photosensitive heterostructure adjacent the transparent first electrode layer, and a second electrode and reflective layer substantially parallel to the first reflective layer and adjacent the photosensitive heterostructure in spaced opposition to the first electrode to form a thin film photovoltaic cell on the bottom of each of the parabolic shaped concentrators,
      wherein one of the first reflective layer or the second electrode and reflective layer is deposited first and adjacent to the concentrators, and has an aperture for admittance of optical radiation to the photosensitive heterostructure; and
   depositing an anti-reflection coating on the upper end of the parabolic shaped concentrators.

8. The method of claim 7 wherein the reflective thin film layer is comprised of a metallic material.

9. The method of claim 7 wherein a protective layer is applied to the bottom surface of the reflective thin film layer.

10. The method of claim 7 wherein the photovoltaic cell includes an anode, an organic layer, and a cathode.

11. The method of claim 7 wherein the concentrators each have a height of about 100 to about 200 $\mu$m.

12. The method of claim 7 wherein the concentrators each have a width of about 100 to about 200 $\mu$m.

13. A method of fabricating a light-trapping photovoltaic device comprising the steps of:

providing a layer of thin film;

shaping the thin film layer into a plurality of parabolic shaped concentrators;

forming an aperture in the bottom of each of the parabolic shaped concentrators;

coating the interior and exterior surfaces of the parabolic shaped concentrators with a reflective material to form a first reflective surface on the interior surfaces of the parabolic shaped concentrators and a second reflective surface on the exterior surfaces of the parabolic shaped concentrators;

encapsulating the parabolic shaped concentrators with a transparent insulating layer;

depositing a second transparent insulating layer, the second transparent insulating layer having a non-planar upper surface in contact with the second reflective surface and a substantially planar lower surface, a transparent first electrode layer in contact with the lower surface of the second transparent insulating layer, a photosensitive heterostructure in contact with the transparent electrode, and a third reflective surface in contact with the photosensitive heterostructure, the third reflective surface being the surface of a reflective second electrode layer, to form a thin film photovoltaic cell on the bottom of each of the parabolic shaped concentrators, wherein incident radiation is directed through the aperture in the bottom of each of the parabolic shaped concentrators and reflected between the second reflective surface and the third reflective surface until the radiation is substantially photoconverted by the photosensitive heterostructure; and depositing an anti-reflection coating on the upper end of the parabolic shaped concentrators.

14. The method of claim 13 wherein the thin film layer is comprised of a polymeric material.

15. The method of claim 13 wherein a protective layer is applied to the bottom surface of the reflective material.

16. The method of claim 13 wherein the thin film photovoltaic cell includes an anode, an organic layer, and a cathode.

17. The method of claim 13 wherein the parabolic shaped concentrators each have a height of about 100 to about 200 $\mu$m.

18. The method of claim 13 wherein the parabolic shaped concentrators each have a width of about 100 to about 200 $\mu$m.

19. A method of fabricating a light-trapping photovoltaic device comprising the steps of:

providing a layer of reflective thin film;

shaping the reflective thin film layer into a plurality of parabolic shaped concentrators to form a first reflective surface on the interior surfaces of the parabolic shaped concentrators and a second reflective surface on the exterior surfaces of the parabolic shaped concentrators;

forming an aperture in the bottom of each of the parabolic shaped concentrators;

encapsulating the parabolic shaped concentrators with a transparent insulating layer;

depositing a second transparent insulating layer, the second transparent insulating layer having a non-planar upper surface in contact with the second reflective surface and a substantially planar lower surface, a transparent first electrode layer in contact with the lower surface of the second transparent insulating layer, a photosensitive heterostructure in contact with the transparent electrode, and a third reflective surface in contact with the photosensitive heterostructure, the third reflective surface being the surface of a reflective second electrode layer, to form a thin film photovoltaic cell on the bottom of each of the parabolic shaped concentrators, wherein incident radiation is directed through the aperture in the bottom of each of the parabolic shaped concentrators and reflected between the second reflective surface and the third reflective surface until the radiation is substantially photoconverted by the photosensitive heterostructure; and depositing an anti-reflection coating on the upper end of the parabolic shaped concentrators.

20. The method of claim 19 wherein the reflective thin film layer is comprised of a metallic material.

21. The method of claim 19 wherein a protective layer is applied to the bottom surface of the reflective thin film layer.

22. The method of claim 19 wherein the thin film photovoltaic cell includes an anode, an organic layer, and a cathode.

23. The method of claim 19 wherein the parabolic shaped concentrators each have a height of about 100 to about 200 $\mu$m.

24. The method of claim 19 wherein the concentrators each have a width of about 100 to about 200 $\mu$m.

* * * * *

UNITED STATES PATENT AND TRADEMARK OFFICE
CERTIFICATE OF CORRECTION

PATENT NO.    : 6,440,769 B2
DATED         : August 27, 2002
INVENTOR(S)   : Peumans et al.

It is certified that error appears in the above-identified patent and that said Letters Patent is hereby corrected as shown below:

Column 5,
Line 49, change "abode" to -- above --;
Line 61, change "electrode." to -- electrode, --; and Column 6,
Line 51, change "IPO" to -- ITO --.

Signed and Sealed this

Eighteenth Day of March, 2003

JAMES E. ROGAN
*Director of the United States Patent and Trademark Office*